US006951593B2

(12) United States Patent
Yamaguchi

(10) Patent No.: US 6,951,593 B2
(45) Date of Patent: Oct. 4, 2005

(54) LAMINATING DEVICE AND LAMINATING METHOD

(75) Inventor: Koichi Yamaguchi, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/204,972

(22) PCT Filed: Sep. 7, 2001

(86) PCT No.: PCT/JP01/07789

§ 371 (c)(1),
(2), (4) Date: Aug. 28, 2002

(87) PCT Pub. No.: WO02/056352

PCT Pub. Date: Jul. 18, 2002

(65) Prior Publication Data

US 2003/0173035 A1 Sep. 18, 2003

(30) Foreign Application Priority Data

Jan. 15, 2001 (JP) ........................................ 2001-006203

(51) Int. Cl.⁷ ............................................. B32B 31/00
(52) U.S. Cl. ........................ 156/230; 156/230; 156/556; 156/580; 156/583.1; 156/583.3
(58) Field of Search ............................. 156/583.1, 583.3, 156/230, 580, 556

(56) References Cited

U.S. PATENT DOCUMENTS

| 4,687,536 A | * | 8/1987 | Hiramatsu et al. | 156/556 |
| 4,927,479 A | * | 5/1990 | Bock | 156/228 |
| 5,129,827 A | * | 7/1992 | Hoshi et al. | 438/457 |
| 5,345,999 A | * | 9/1994 | Hosokawa | 165/80.2 |
| 5,470,420 A | * | 11/1995 | Yokajty | 156/566 |
| 5,951,819 A | * | 9/1999 | Hummell et al. | 156/556 |
| 6,196,290 B1 | * | 3/2001 | Tracy et al. | 156/391 |
| 6,240,990 B1 | * | 6/2001 | Claussnitzer | 156/391 |

FOREIGN PATENT DOCUMENTS

| JP | 61-182239 | | 8/1986 |
| JP | 2-123726 | | 5/1990 |
| JP | 4-324613 | | 11/1992 |
| JP | 5-90393 | | 4/1993 |
| JP | 5-217973 | | 8/1993 |
| JP | 5-326353 | | 12/1993 |
| JP | 59-138336 A | * | 8/1994 |
| JP | 7-66093 | | 3/1995 |
| JP | 7-320995 | | 12/1995 |
| JP | 2000-348992 | | 12/2000 |

* cited by examiner

*Primary Examiner*—Blaine Copenheaver
*Assistant Examiner*—Barbara J Musser
(74) *Attorney, Agent, or Firm*—Lowe Hauptman & Berner, LLP

(57) ABSTRACT

A laminating device 10 includes a vacuum grid 19 for holding a glass substrate 12, a curved pad 20, facing the glass substrate 12, for holding a laminated element 16 of a wafer 13 and an adhesive tape 15, and a driving element 22 for moving the curved pad 20 toward the vacuum grid 19. The curved pad 20 has a curved surface region 46 so that the distance to a smooth surface region 39 of the vacuum grid 19 is gradually increased from the center C toward the outside. By the driving element 22, the vacuum grid 19 and the curved pad 20 become close to each other in a substantially vacuum chamber. As a result, the glass substrate 12 and the laminated element 16 are gradually laminated to each other while removing a very small amount of air that may be present therebetween to the outside.

17 Claims, 15 Drawing Sheets

FIG. 11
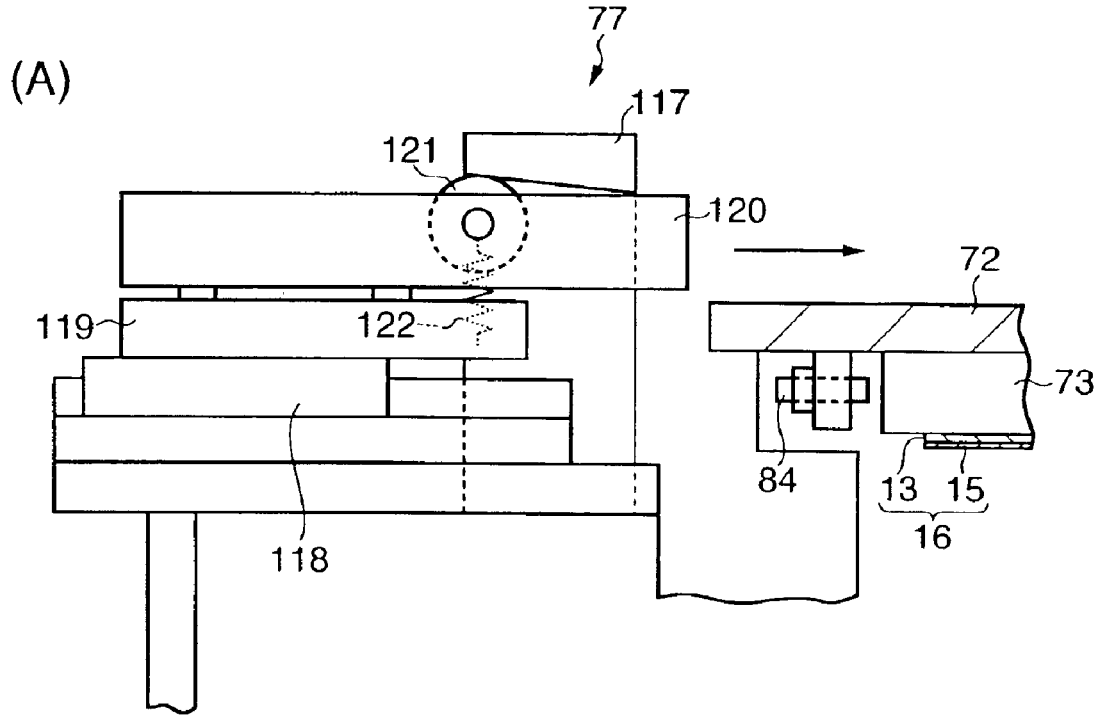
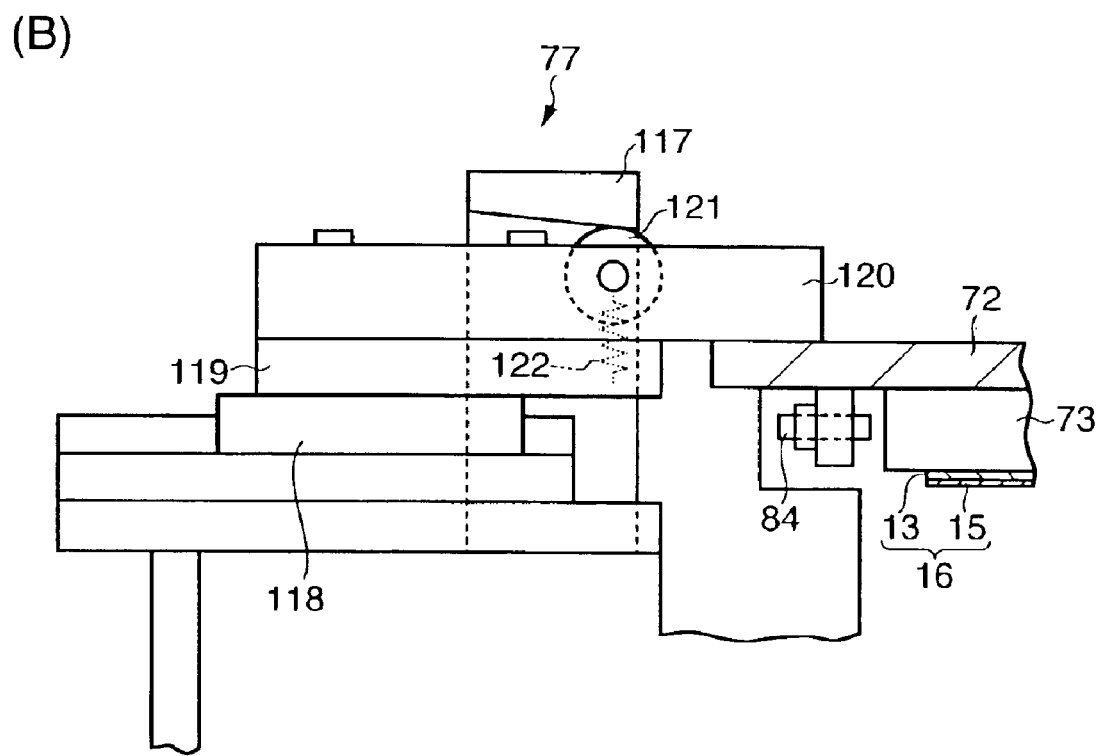

LAMINATING DEVICE AND LAMINATING METHOD

TECHNICAL FIELD

The present invention relates to a laminating device and a laminating method capable of preventing the air from being trapped in the resultant lamination when first and second members to be laminated having opposing laminating surfaces are laminated to each other.

RELATED ART

Conventionally, a substantially disk-like semiconductor wafer having a multiplicity of circuit patterns formed on its surface (hereinafter, simply referred to as "wafer") is known. The wafer thickness is commonly adjusted by machining the rear surface of the wafer with a grinder or the like after forming the circuit patterns. Due to the recent demand for ultrathin wafers, the wafer thickness, which is conventionally about 300 $\mu$m, is reduced to about 100 $\mu$m to about 50 $\mu$m. Since the wafer is already thin before the machining process, cracks or the like are likely to occur if the wafer is machined without any pretreatment. Accordingly, the machining process is sometimes conducted after a glass substrate or the like is laminated to the circuit surface of the wafer for reinforcement by using a double-sided adhesive tape.

Moreover, in the dicing process for dicing the wafer into chips, flaws or cracks are likely to be produced as a result of cutting the ultrathin wafer. Accordingly, as in the machining process, the dicing process is also required to be conducted after a glass substrate is laminated to the rear surface of the wafer, the surface opposite to the circuit surface, in order to reinforce the ultrathin wafer.

Since the double-sided adhesive tape is flexible, one surface of the double-sided adhesive tape can be laminated to one surface of the wafer by warping one side of the adhesive tape and gradually pressing the adhesive tape from the other side thereof while removing the air. However, since the wafer and the glass substrate are less flexible than the adhesive tape, it is difficult to laminate the glass substrate to the other surface of the adhesive tape, the surface opposite to that laminated to the wafer, while removing the air by warping one end of either the wafer or glass substrate to a large degree. Therefore, air is likely to be trapped between the wafer and the glass substrate, and thus it is likely to be trapped partially in the resultant lamination. Such trapped air would hinder the rear surface of the wafer, the surface to be machined, from being held substantially horizontally in the machining process, thereby degrading accuracy of the machining surface of the wafer. Moreover, chips having a distorted cutting surface or the like are likely to be produced in the dicing process.

The present invention is made in view of the above problems, and it is an object of the present invention to provide a laminating device and a laminating method capable of preventing the air from being trapped in the resultant lamination when a first member to be laminated such as glass substrate and a second member to be laminated such as wafer are laminated to each other.

DISCLOSURE OF THE INVENTION

In order to achieve the above object, according to one aspect of the present invention, a laminating device for laminating first and second members to be laminated having opposing laminating surfaces includes first and second holding means for holding the first and second members to be laminated, and moving means for allowing the first and second holding means to become close to and away from each other. In this laminating device, a holding surface of one of the first and second holding means has a curved surface region curved so that a distance between the first and second members to be laminated is gradually increased outward. The moving means makes the first and second holding means close to each other so as to enable the first and second members to be laminated to be gradually laminated to each other toward an outer end of the curved surface region. This structure enables the air remaining between the first and second members to be laminated to be removed to the outside along the curved surface region in the operation of laminating the first and second members to be laminated. As a result, the air can be prevented from being trapped in the resultant lamination in the operation of laminating the first and second members to be laminated. In particular, even when the first and second members to be laminated are less flexible members, the air can be reliably prevented from being trapped in the resultant lamination in the operation of laminating the members to be laminated.

According to another aspect, a laminating device for laminating first and second members to be laminated having opposing laminating surfaces includes first and second holding means for holding the first and second members to be laminated, and moving means for allowing the first and second holding means to become close to and away from each other. In this laminating device, a holding surface of one of the first and second holding means has a curved surface region curved so that a distance to a holding surface of the other holding means is gradually increased from its center toward outside. The moving means makes the respective holding surfaces of the first and second holding means close to each other so as to enable the first and second members to be laminated to be gradually laminated to each other from their center toward outside. The above object is also achieved by this laminating device.

The moving means includes a pair of driving devices provided at symmetric positions with respect to the center of the curved surface region, and the first and second holding means gradually become close to each other by simultaneously or alternately operating the driving devices. In this structure, operating the driving devices at different timings or speeds enables the first and second holding means to become close to each other with one holding surface tilted with respect to the other. In combination with the shape of the curved surface region, this structure makes it possible to implement the aforementioned removal of the air with improved reliability. Preferably, each driving device includes a cylinder that enables a connecting member provided in at least one of the first and second holding means to move in the direction that the first and second holding means get close to and away from each other, and each connecting member has a joint that enables bending of the connecting member. In this structure, bending of the connecting members enables the operation of laminating the members to be laminated to be conducted smoothly.

According to still another aspect of the present invention, a laminating device for laminating first and second members to be laminated having opposing laminating surfaces in a substantially vacuum space. In this laminating device, second holding means for holding the second member to be laminated is a curved pad for pressing the second member to be laminated against the first member to be laminated. The curved pad has a curved surface region at a tip portion thereof so that a thickness thereof is gradually reduced from its center toward outside. The curved pad makes the first and second members to be laminated close to each other so as to enable the first and second members to be laminated to be gradually laminated to each other from their center toward outside. The above object is also achieved by this laminating device.

Preferably, the curved pad is a hard member and the curved surface region is a mirror-finished region.

According to yet another aspect of the present invention, in a laminating device for laminating first and second members to be laminated having opposing laminating surfaces, a holding surface of one holding means has a tilted flat surface region tilted so that a distance between the first and second members to be laminated is gradually increased inward, and a curved surface region connected to the tilted flat surface region and curved so that the distance between the first and second members to be laminated is gradually increased outward. The moving means makes the first and second holding means close to each other so as to enable the first and second members to be laminated to be gradually laminated to each other from an outer end of the tilted flat surface region toward an outer end of the curved surface region. This structure also prevents the air from being trapped in the resultant lamination in the operation of laminating the first and second members to be laminated.

A protrusion may be formed approximately at a center of the holding surface of the one holding means so as to slightly protrude from a surrounding region, and the protrusion may be compressively deformable in a process of laminating the first and second members to be laminated to each other. In this structure, the protrusion is compressively deformed while the first and second members to be laminated are being laminated to each other. This reliably prevents the air from being trapped in a region where the air is likely to be trapped.

Preferably, at least one of the members to be laminated has an adhesive on its laminating surface, and the holding means for holding the member to be laminated having the adhesive has heating means for heating the adhesive. This structure enables the first and second members to be laminated to be laminated to each other with the adhesive melted by the heating means. Since the members to be laminated are laminated to each other with a softened adhesive, the air present between the first and second members to be laminated can be more easily removed to the outside in the laminating operation.

The first and second members to be laminated may be capable of being laminated to each other in a substantially vacuum space. This more reliably prevents the air from being trapped between the first and second members to be laminated in the laminating operation.

According to a further aspect of the present invention, in a method for laminating first and second members to be laminated having opposing laminating surfaces, one of the first and second members to be laminated is held on a curved surface region curved so that a distance between the first and second members to be laminated is gradually increased outward, and the first and second members to be laminated are made to become close to each other, whereby the members to be laminated are gradually laminated to each other toward an outer end of the curved surface region. Preferably, the members to be laminated are gradually laminated to each other from their prescribed one end toward the other end, that is, the outer end of the curved surface region.

According to a still further aspect of the present invention, in a method for laminating first and second members to be laminated having opposing laminating surfaces, the first and second members to be laminated are made to become close to each other so that the members to be laminated are gradually laminated to each other from their center toward outside.

BRIEF DESCRIPTION OF THE DRAWINGS

FIG. 11(A) is an enlarged side view of a lock mechanism, showing the unlocked state of second holding means;

FIG. 11(B) is an enlarged side view of the lock mechanism, showing the locked state of the second holding means;

BEST MODE FOR CARRYING OUT THE INVENTION

Hereinafter, embodiments of the present invention will be described with reference to the drawings.

Figure 1:
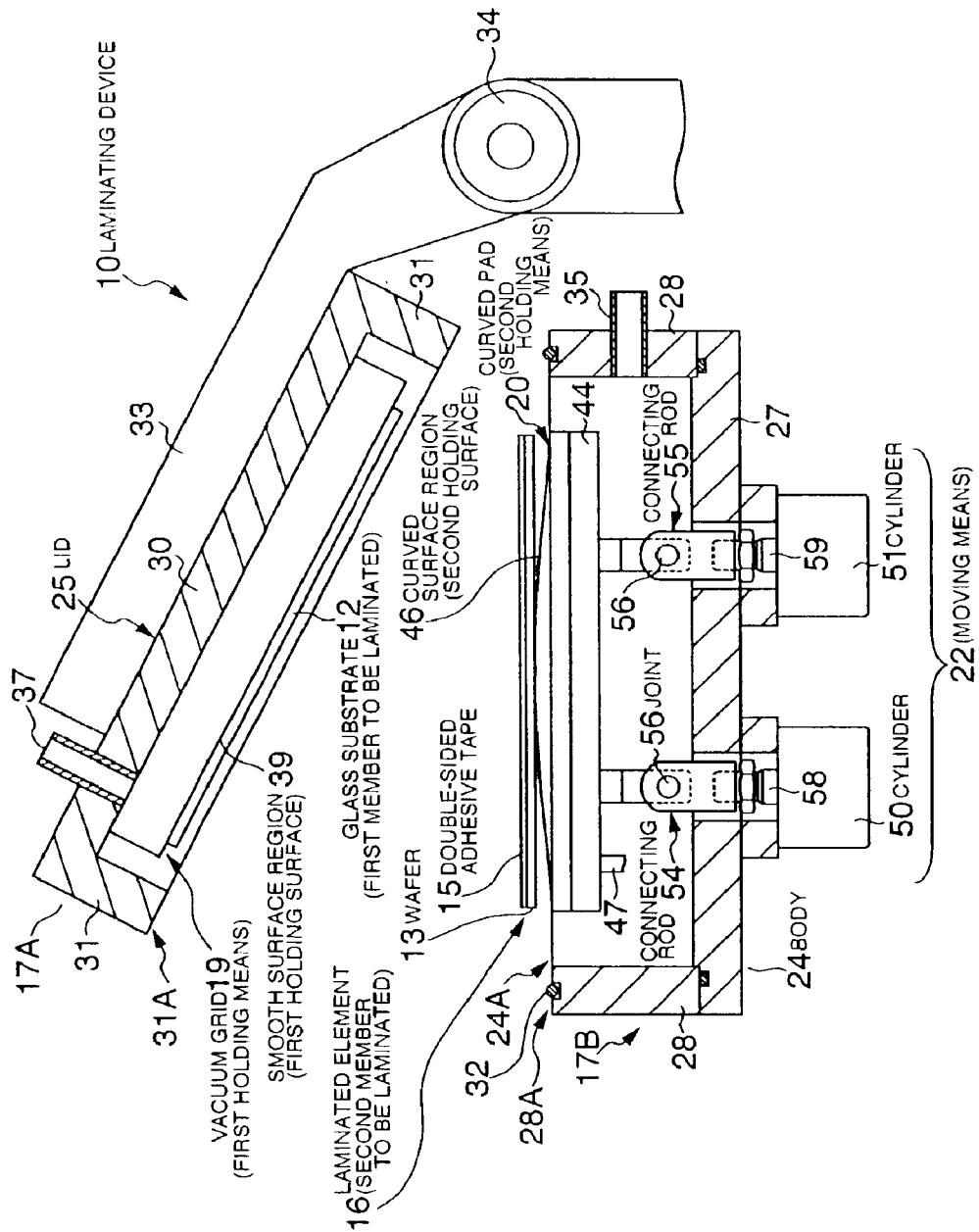
FIG. 1 is a conceptual diagram of a laminating device according to a first embodiment.
Figure 2:
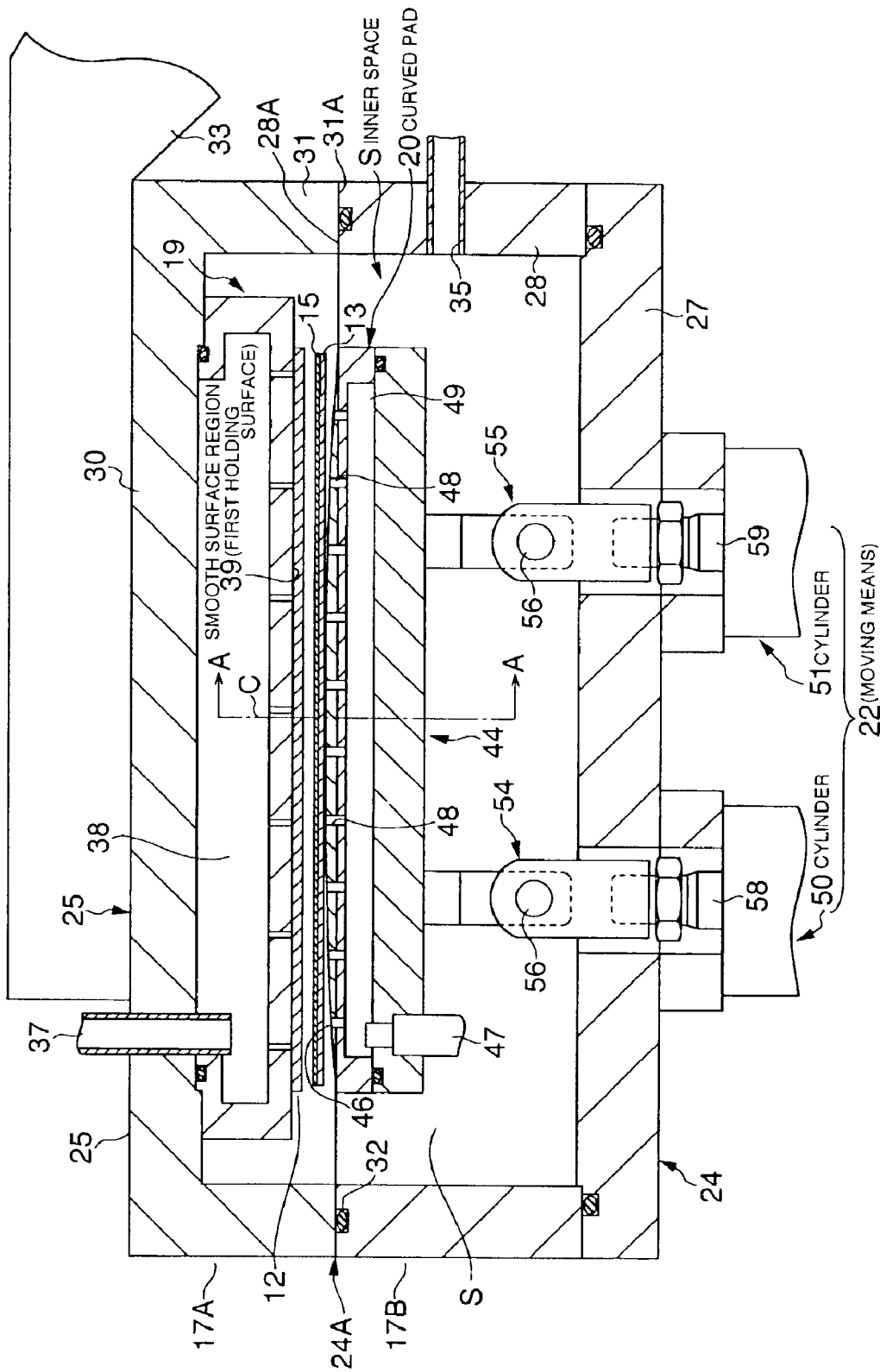
FIG. 2 is an enlarged cross sectional view of an essential portion of FIG. 1.
Figure 3:
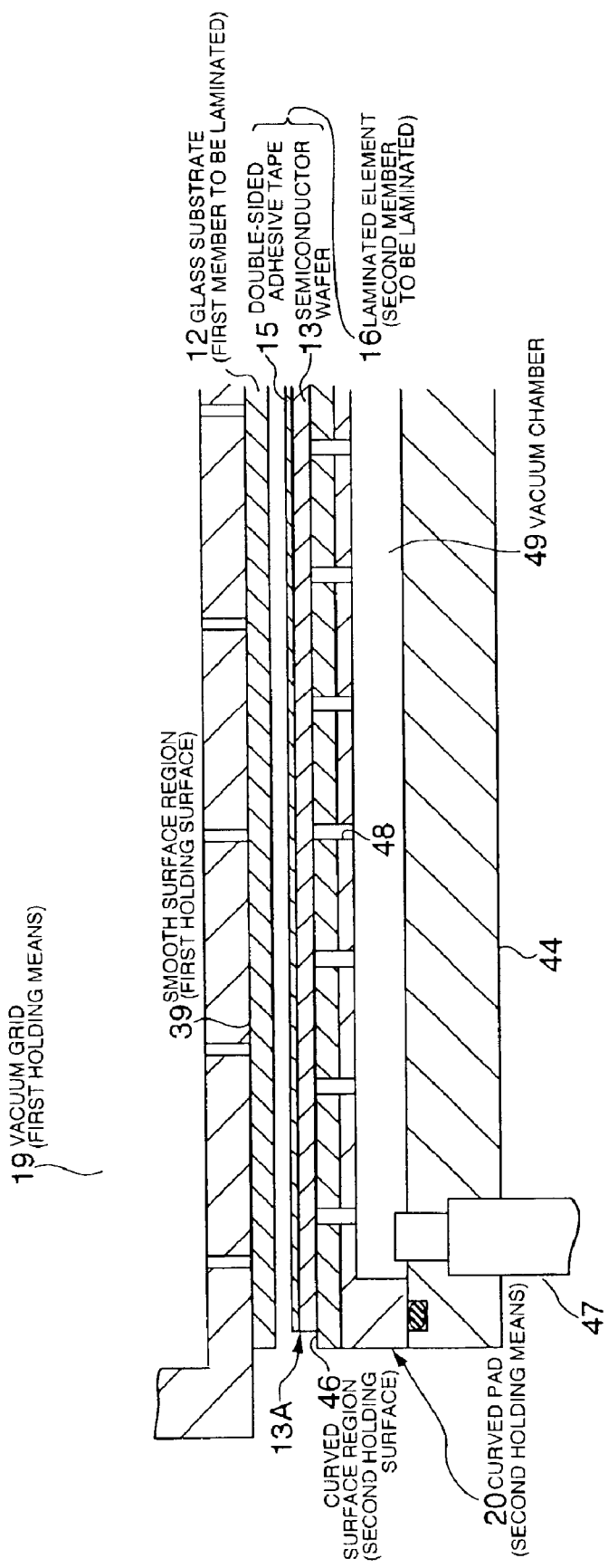
FIG. 3 is a partial enlarged cross sectional view taken along line A—A in FIG. 2.

FIG. 1 is a conceptual diagram of a laminating device according to a first embodiment. FIG. 2 is an enlarged cross sectional view of an essential portion of FIG. 1, and FIG. 3 is an enlarged cross section taken along line A—A in FIG. 2. In these figures, a laminating device 10 is configured as an apparatus for laminating a glass substrate 12 (first member to be laminated) and a laminated element 16 (second member to be laminated) of a disc-like wafer 13 and a double-sided adhesive tape 15 to each other in a substantially vacuum chamber. The laminating device 10 includes vacuum chamber forming members 17A, 17B capable of forming a vacuum chamber, first holding means provided within the upper vacuum chamber forming member 17A in FIG. 1, for sucking and holding the glass substrate 12 (hereinafter, referred to as "vacuum grid 19"), second holding means for sucking and holding the surface of the wafer 13 of the laminated element 16 under the glass substrate 12 held by the vacuum grid 19 (hereinafter, referred to as "curved pad 20"), and moving means 22 for moving the curved pad 20 toward and away from the vacuum grid 19.

The vacuum chamber forming members 17A, 17B include a body 24 shaped like a bottomed container opened at its top, and a lid 25 capable of being opened and closed at a closed position 24A of the body 24. The body 24 is formed by a bottom wall 27 and a lower sidewall 28 extending vertically along the peripheral edge of the bottom wall 27. The lid 25 is shaped like a bottomed container opened at its bottom. The lid 25 includes a top wall 30 having substantially the same two-dimensional size as that of the bottom wall 27, an upper sidewall 31 extending downward from the peripheral edge of the top wall 30, and a rotary arm 33 fixed to the outer surface of the top wall 30. The rotary arm 33 is rotatably supported at a rotation shaft 34 by the power of a not-shown motor or the like. The rotation shaft 34 is provided outside the vacuum chamber forming member 17A. Rotation of the rotary arm 33 allows the lid 25 to be opened and closed at the closed position 24A of the body 24. In the closed state at the closed position 24A (see FIG. 2), a lower end face 31A of the upper sidewall 31 of the lid 25 faces an upper end face 28A of the lower sidewall 28 of the body 24 in close contact with each other by a sealant 32. The inner space S formed by the body 24 and the lid 25 can be sealed in this way. By actuating a not-shown vacuum generator, the air within the inner space S is evacuated through an exhaust pipe 35 formed in the lower sidewall 28. As a result, the substantially vacuum inner space S is obtained.

The vacuum grid 19 is fixed to the inner surface of the top wall 30 of the lid 25. A vacuum hose 37 connected to a not-shown vacuum pump is attached to the vacuum grid 19. By actuating the vacuum pump, a vacuum pressure is produced in an inner vacuum chamber 38, whereby the glass substrate 12 is sucked and held on a smooth surface region 39 (first holding surface), that is, a sucking surface. Note that the glass substrate 12 thus sucked and held extends substantially horizontally when the lid 25 is moved to the closed position 24.

The curved pad 20 is a hard member such as an aluminum member having an alumite curved surface region 46 (second holding surface) at its top. The curved pad 20 is positioned substantially horizontally and supported by a support base 44. The curved pad 20 has a curved shape with its thickness gradually reduced from the center C to both sides in the left-right direction in FIG. 2. As shown in FIG. 3 (cross section taken along line A—A in FIG. 2), the curved surface region 46 at the top of the curved pad 20 extends horizontally in cross section along the direction perpendicular to the plane of FIG. 2 (the left-right direction in FIG. 3) so as to suck and hold the surface of the wafer 13 of the laminated element 16. The curved surface region 46 has a mirror-finished surface, and is curved so that the distance to the opposing smooth surface region 39 is gradually increased from the center C to both sides in the figure. The curved surface region 46 has a multiplicity of suction holes 48 leading to a vacuum chamber 49 (FIG. 2). The vacuum chamber 49 communicates with a vacuum pipe 47 connected to a not-shown suction apparatus. The vacuum pressure causes the wafer 13 having the double-sided adhesive tape 15 laminated thereon, that is, the laminated element 16, to be sucked and held on the curved surface region 46 through the suction holes 48. Not that the double-sided adhesive tape 15 is attached to a circuit surface (top surface in FIG. 3) 13A of the wafer 13.

The moving means 22 includes left and right cylinders 50, 51 and connecting rods 54, 55. The cylinders 50, 51 form a pair of driving devices provided at symmetric positions with respect to the center C of the curved surface region 46. The connecting rods 54, 55 serve as connecting members for connecting the cylinders 50, 51 with the support base 44 of the curved pad 20, respectively.

The respective bodies of the cylinders 50, 51 are provided outside of the bottom wall 27 of the vacuum chamber forming member 17B. The curved pad 20 is raised and lowered by advancing and retracting left and right piston rods 58, 59 connected to the respective connecting rods 54, 55. The curved pad 20 can thus be moved toward and away from the vacuum grid 19. The cylinders 50, 51 can move the respective piston rods 58, 59 up and down at different timings. In the present embodiment, the left piston rod 58 and the right piston rod 59 move up and down in an alternate manner. The connecting rods 54, 55 are bendable in the left-right direction in FIG. 2 at their respective joints 56, 56 (joint). The joints 56, 56 are provided at an intermediate position of the respective connecting rods 54, 55 as connecting members. This allows the operation to be implemented smoothly even when the left and right piston rods 58, 59 move upward at different speeds.

Hereinafter, the procedures of laminating the laminated element 16 to the glass substrate 12 by the laminating device 10 will be described in conjunction with FIGS. 1 to 6.

First, the double-sided adhesive tape 15 is attached to the circuit surface 13A of the wafer 13 to form the laminated element 16. Then, with the lid 25 of the vacuum chamber forming member 17A opened (see FIG. 1), the glass substrate 12 is positioned on the vacuum grid 19 of the lid 25 and then sucked and held thereon. Moreover, the laminated element 16 is placed on the curved surface region 46 of the curved pad 20 with the surface of the wafer 13 facing downward. The laminated element 16 is sucked and held on the curved pad 20. As shown in FIG. 2, the lid 25 is closed so that the vacuum chamber forming members 17A, 17B closely contact each other, thereby forming a sealed inner space S. The air within the inner space S is then evacuated so that the inner space S forms a substantially vacuum chamber.

Figure 4:
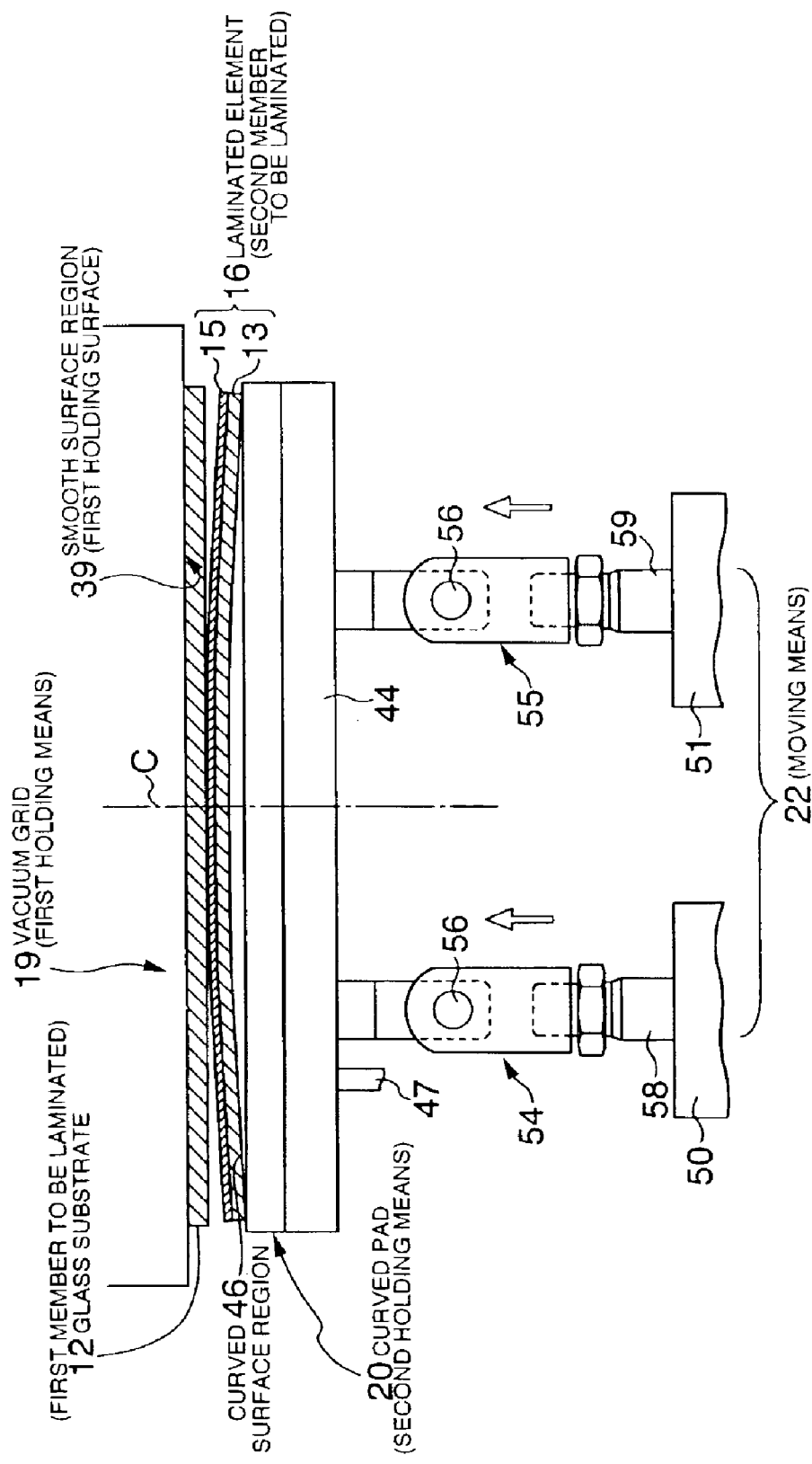
FIG. 4 is a schematic view showing the state where a glass substrate is laminated to the center of a laminated element (wafer)
Figure 5:
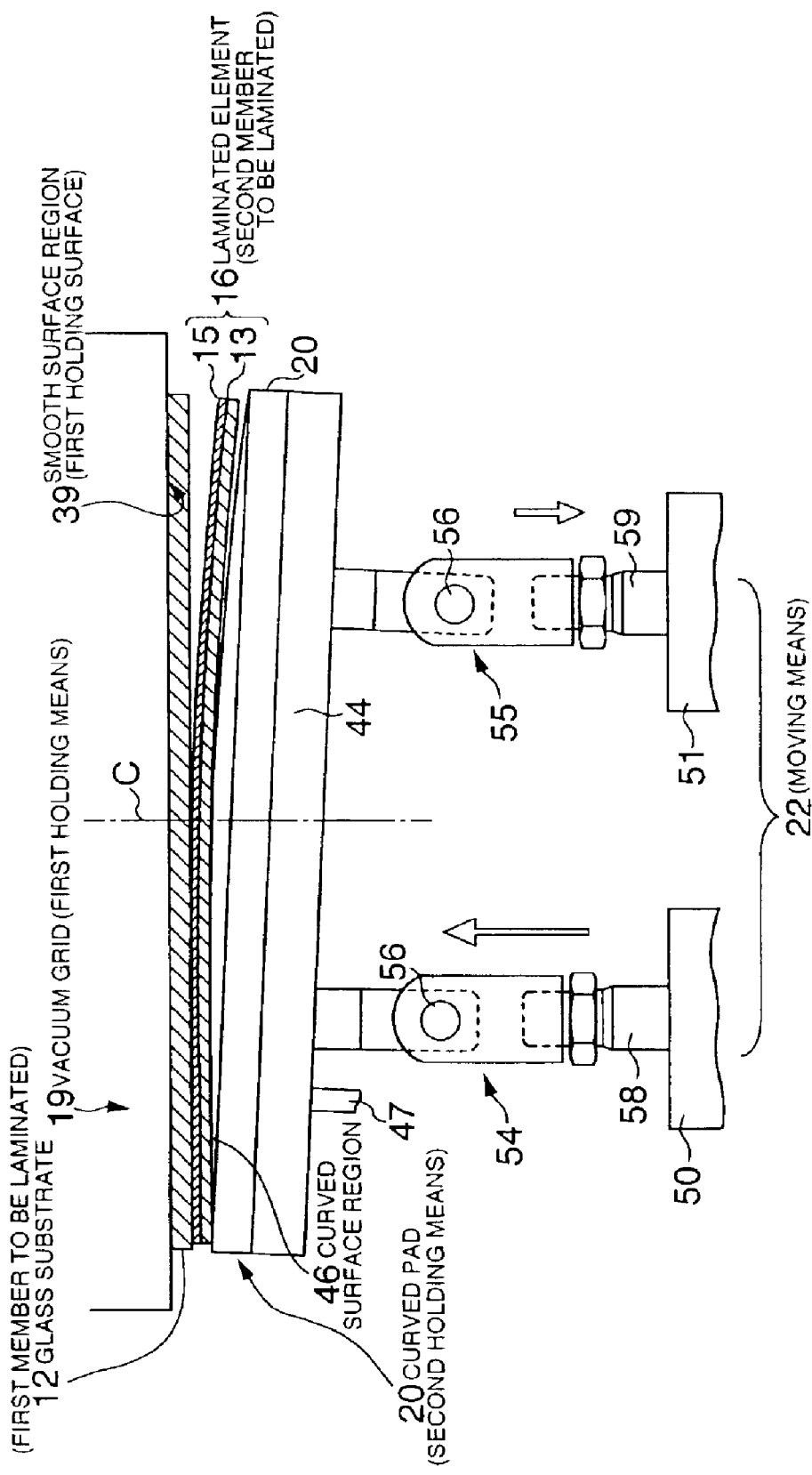
FIG. 5 is a schematic view showing the state where the left half of the glass substrate is laminated to the left half of the laminated element (wafer)
Figure 6:
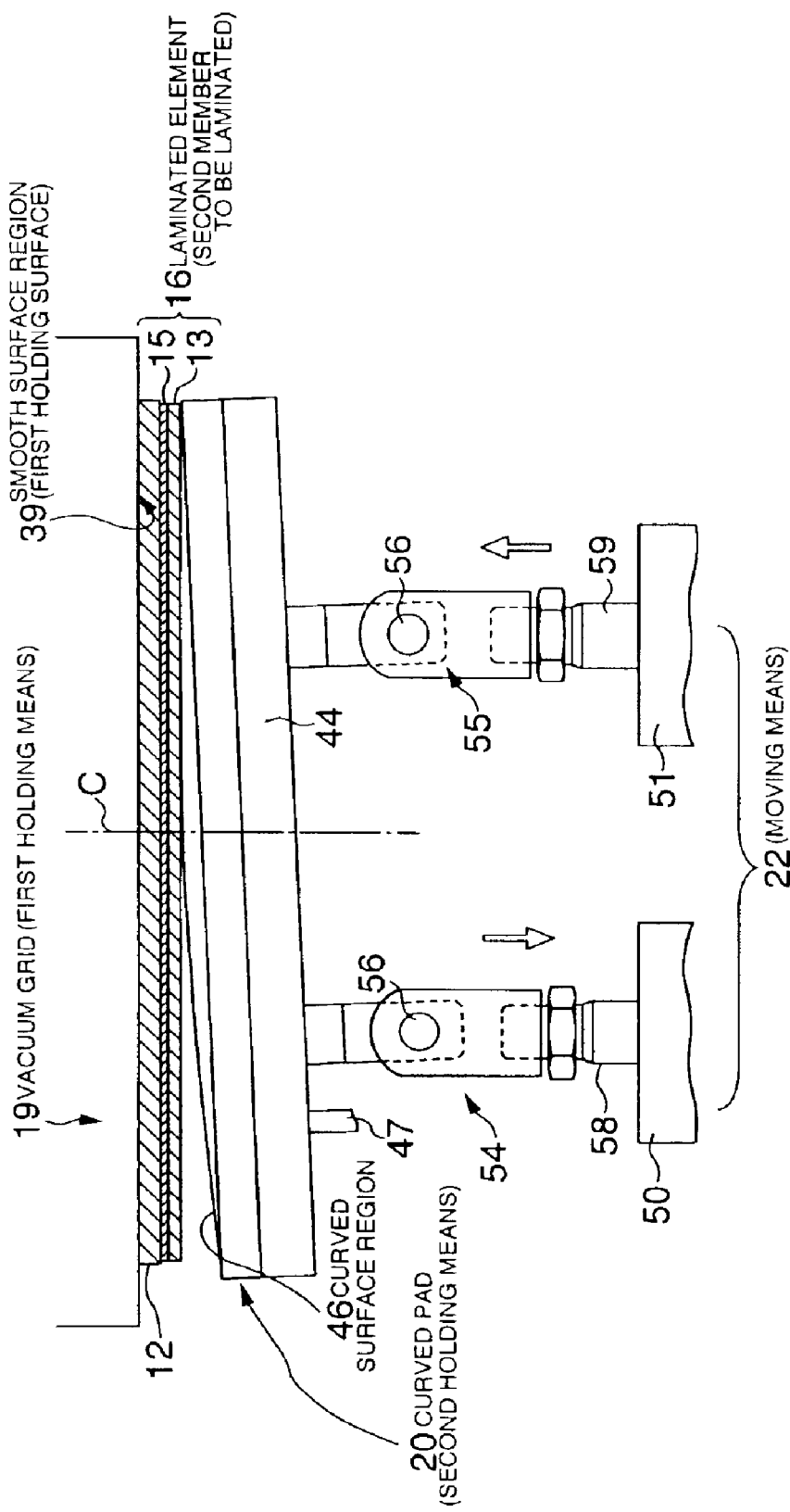
FIG. 6 is a schematic view showing the state where the glass substrate is approximately completely laminated to the laminated element (wafer)

Thereafter, the left and right cylinders 50, 51 are simultaneously driven from the initial state where the glass substrate 12 and the laminated element 16 face each other at an approximately uniform distance. As a result, the respective piston rods 58, 59 of the cylinders 50, 51 move upward, whereby the glass substrate 12 and the laminated element 16 are pressed against each other at positions near the center C of the curved surface region 46 (FIG. 4). With the piston rod 58 of the left cylinder 50 being held at the lifted position, the piston rod 59 of the right cylinder 51 starts moving downward (in the direction shown by the arrow) (FIG. 5). The curved pad 20 holding the laminated element 16 thus starts pivoting so as to be gradually tilted downward from left to right in FIG. 5. The displacement between the piston rods 58, 59 is gradually increased and the tilt angle of the curved pad 20 is further increased. As a result, the left half of the double-sided adhesive tape 15 of the laminated element 16 in the figure is gradually laminated to the glass substrate 12 along the curved surface region 46 of the curved pad 20 while removing a very small amount of air to the outside that is present on the left hand of the center C in the figure. In response to a signal indicating that the piston rod 59 of the right cylinder 51 has completely moved down, the piston rod 58 of the left cylinder 50 held at the lifted position starts moving downward. At the same time, the piston rod 59 of the right cylinder 51 starts moving upward. As a result, the curved pad 20 pivots in the opposite direction so as to gradually reduce the tilt angle thereof. The other half (right half in FIG. 6) of the laminated element 16 and the glass substrate 12 are gradually laminated each other while removing the air from the center C to the outside (FIG. 6). The glass substrate 12 and the laminated element 16 are thus completely laminated each other.

After the laminated element 16 is thus laminated to the glass substrate 12, the laminated element 16 fixed to the glass substrate 12 is taken out of the laminating device by a not-shown robotic hand or the like. The wafer 13 fixed to the glass substrate 12 is then transferred to the subsequent machining process of machining and polishing it with a grinder or the like.

According to the first embodiment, the wafer 13 and the glass substrate 12 are laminated to each other with the double-sided adhesive tape 15 in a substantially vacuum state while removing the air from the center C to the outside. The air can thus be prevented from being trapped in the laminating process.

Not that, in the first embodiment, the curved pad 20 is moved toward the vacuum grid 19. However, the vacuum grid 19 may be moved toward the curved pad 20. Alternatively, both the vacuum grid 19 and the curved pad 20 may be moved toward and away from each other.

The left and right cylinders 50, 51 are herein simultaneously driven to press the center C (FIG. 4), and the curved pad 20 is then pivoted so that the laminating process is sequentially conducted in order of FIGS. 5 and 6. However, alternatively, the laminated element 16 and the glass substrate 12 may be laminated to each other by first actuating only one cylinder 50 to the state of FIG. 5 and then controlling the cylinders 50, 51 to the state of FIG. 6 by actuating the cylinder 51.

The glass substrate 12 is herein used as a first member to be laminated and the laminated element 16 is used as a second member to be laminated. However, the laminated element 16 may be used as a first member to be laminated and the glass substrate 12 may be used as a second member to be laminated.

Although the first embodiment enables the glass substrate 12 and the laminated element 16 to be laminated to each other in a substantially vacuum space, the glass substrate 12 and the laminated element 16 may alternatively be laminated to each other in a space that is not in a substantially vacuum state. However, the first embodiment more reliably prevents the air from being trapped between the glass substrate 12 and the laminated element 16.

Hereinafter, a second embodiment of the present invention will be described. Note that, in the following description, the same or equivalent components as those of the first embodiment are denoted with the same reference numerals, and description thereof will be omitted or given briefly.

The second embodiment is characterized in that a laminating device 70 with a structure different from that of the laminating device 10 of the first embodiment is applied to for laminating the glass substrate 12 as a first member to be laminated and the laminated element 16 as a second member to be laminated to each other.

Figure 7:
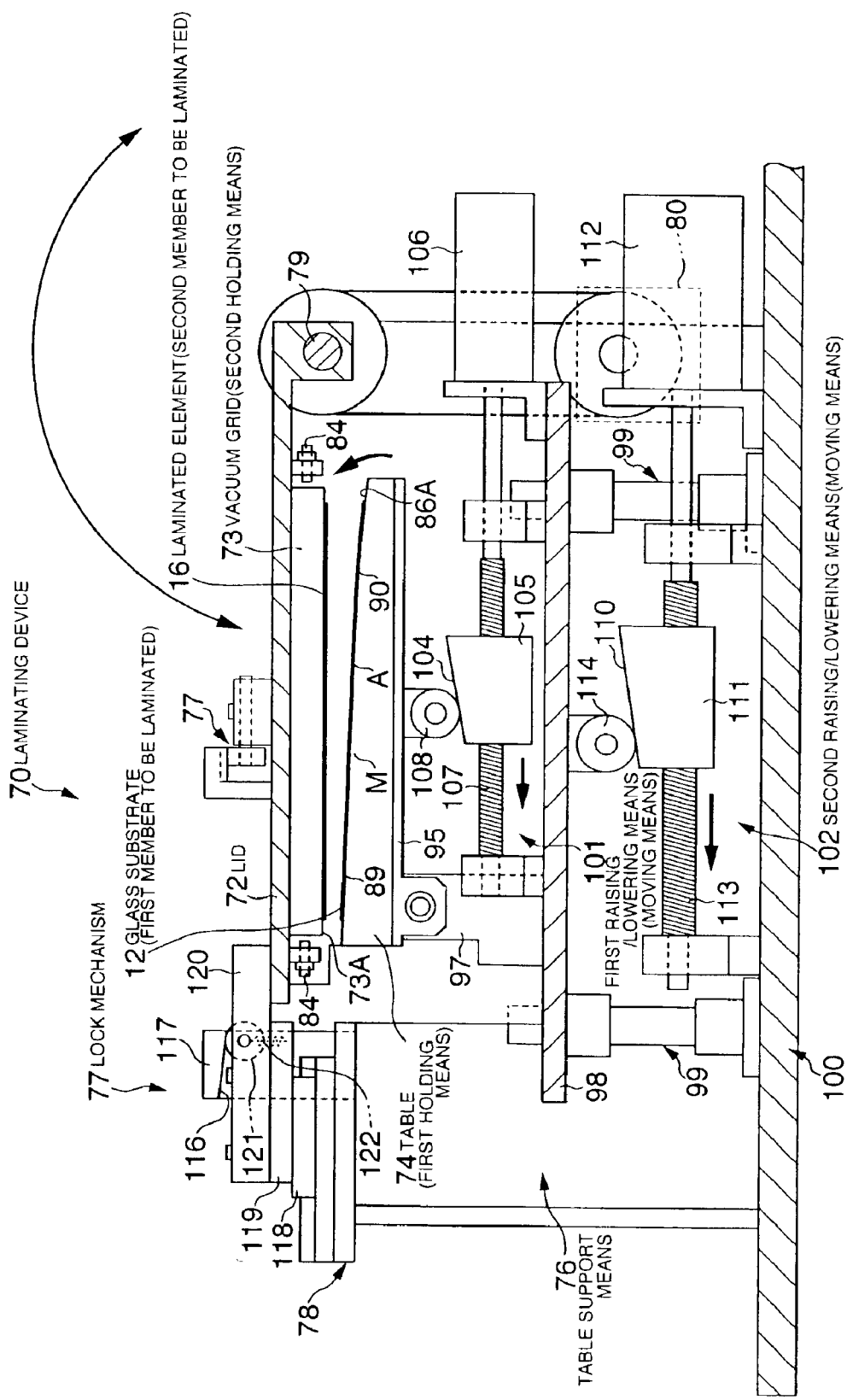
FIG. 7 is a conceptual sectional side view of a laminating device according to a second embodiment.
Figure 8:
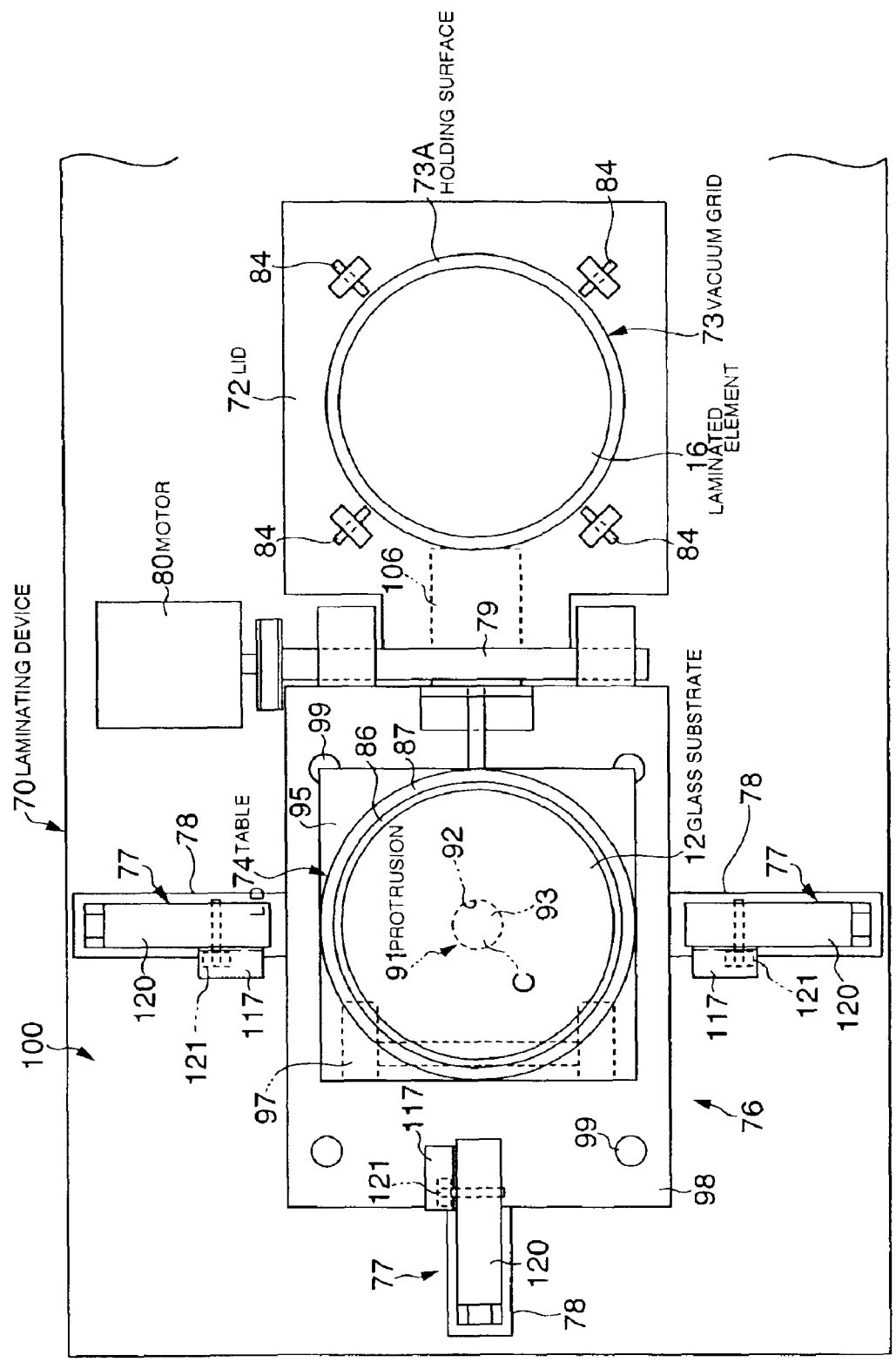
FIG. 8 is a conceptual plan view of the laminating device according to the second embodiment.
Figure 9:
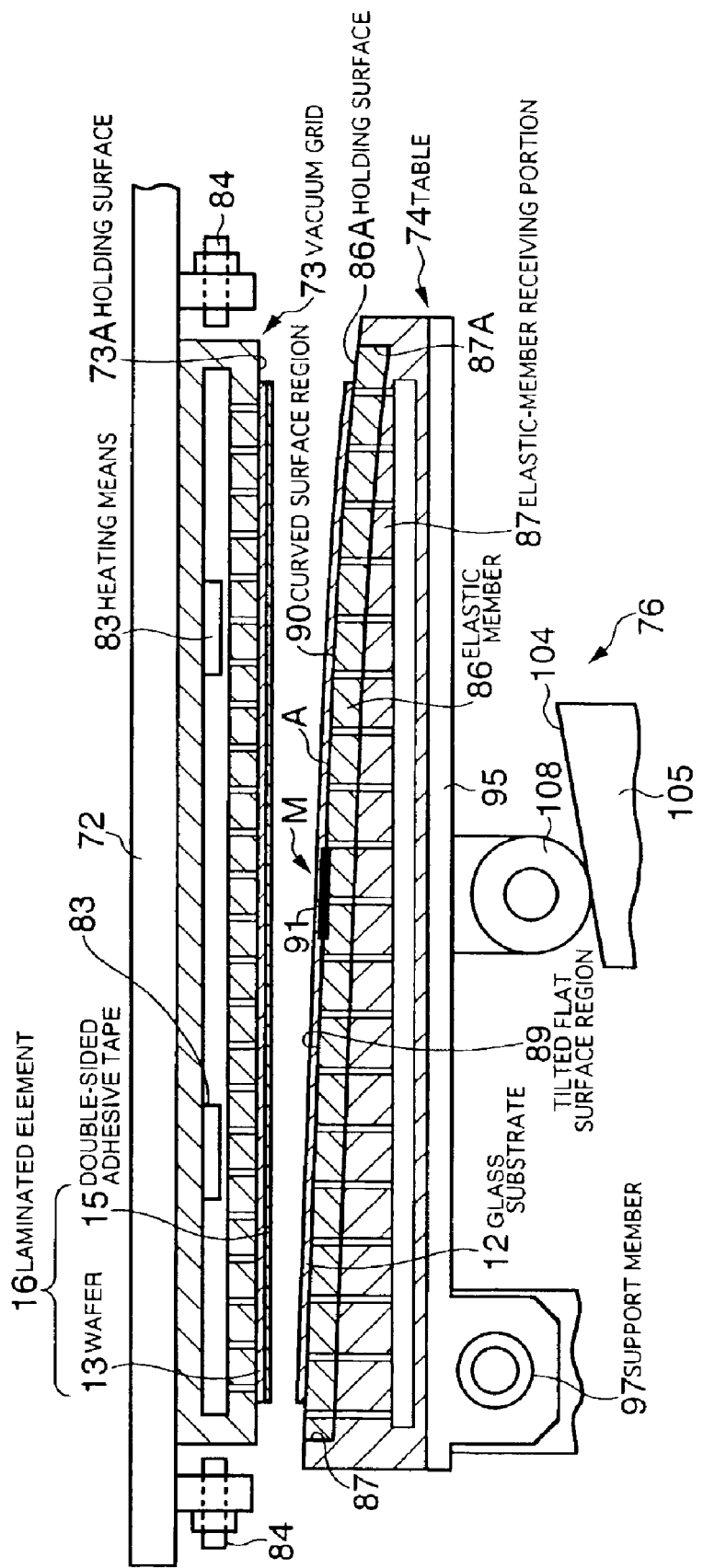
FIG. 9 is an enlarged cross sectional view of an essential portion when viewed along a plane different from that of FIG. 7.

As shown in FIGS. 7 to 9, the laminating device 70 includes a lid 72 having a shape of a substantially rectangular plate and pivotable about the right end in FIG. 7, a vacuum grid 73 (second holding means) attached to the inner surface of the lid 72 (the lower surface in FIG. 7), for sucking and holding the laminated element 16, a table 74 (first holding means) positioned so as to face the vacuum grid 73 when the lid 72 is closed as shown in FIG. 7, for sucking and holding the glass substrate 12, a table support means 76 for supporting the table 74 so that the table 74 can be moved toward and away from the vacuum grid 73, and a plurality of lock mechanisms 77 provided on the outer periphery of the lid 72, for locking the lid 72 in the closed state.

The lid 72 is rotatably supported by a rotation shaft 79 located at the right end in FIG. 7. A free end of the lid 72, that is, the left end in the figure, is rotatable within about 180 degrees by a motor 80 (see FIG. 8). The lid 72 is held substantially horizontally both in the opened state (FIG. 8) and closed state (FIG. 7).

As shown in FIG. 8, the vacuum grid 73 is shaped approximately like a disk, and is sized to be included within the outer peripheral edge of the lid 72 when viewed two-dimensionally. The vacuum grid 73 has substantially the same suction mechanism as that of the vacuum grid 19 of the first embodiment. The vacuum grid 73 has an approximately flat holding surface 73A at the bottom in FIG. 9 in order to suck and hold the laminated element 16 thereon. In particular, when the lid 72 is in the closed state as shown in FIGS. 7 and 9, the laminated element 16 is sucked and held substantially horizontally with the double-sided adhesive tape 15 of the laminated element 16 facing downward. The vacuum grid 73 incorporates heating means 83 (see FIG. 9) such as a heater so that an adhesive of the double-sided adhesive tape on the laminating surface can be heated with the laminated element 16 being sucked and held on the vacuum grid 73. Note that the vacuum grid 73 is slidable in the left-right direction in FIG. 9 along the inner surface of the lid 72. The initial position of the laminated element 16 in the left-right direction in the figure is adjustable by an adjust screw 84 capable of advancing toward and retracting from the vacuum grid 73.

As shown in FIG. 8, the table 74 has an approximately circular shape when viewed from the top. The table 74 has substantially the same suction mechanism as that of the curved pad 20 of the first embodiment and is capable of sucking and holding the glass substrate 12 on its top surface. As shown in FIG. 9, the table 74 includes a substantially disk-like elastic member 86 formed from silicone rubber, and an elastic-member receiving portion 87 formed from stainless. The elastic member 86 is located in the upper part of the table 74. The elastic-member receiving portion 87 has a recess 87A for receiving the elastic member 86 approximately without any clearance therebetween without using an adhesive.

Figure 10:
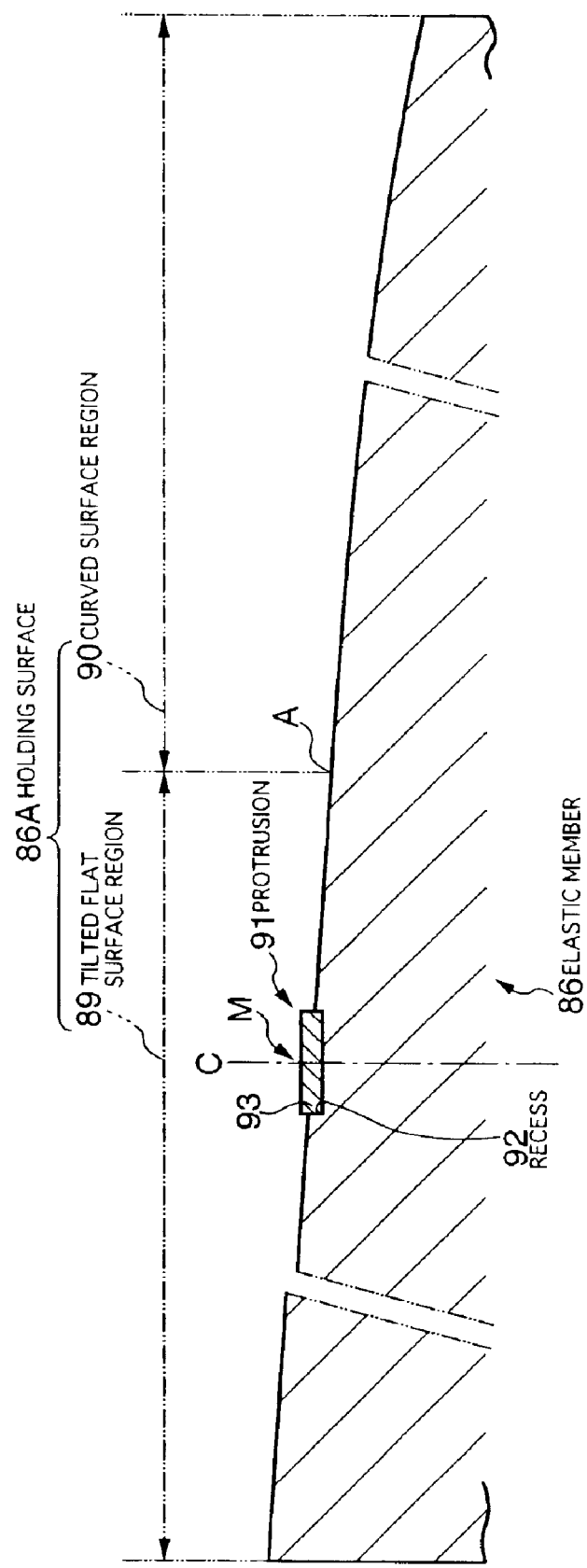
FIG. 10 is an enlarged view of an elastic member.

The upper surface of the elastic member 86 serves as a surface 86A for holding the glass substrate 12. As macroscopically shown in FIG. 10, the holding surface 86A has a tilted flat surface region 89 having a substantially linear profile when viewed laterally and a curved surface region 90 having an approximately circular-arc profile when viewed laterally. The tilted flat surface region 89 is tilted downward from the outside toward the inside, that is, from left to right in the figure. The curved surface region 90 is connected to the tilted flat surface region 89 and is curved downward to the outside, that is, to the right in the figure. Accordingly, before lamination, that is, in the state as shown in FIG. 9, the glass substrate 12 held on the table 74 and the laminated element 16 held on the vacuum grid 73 are positioned at a distance gradually increased from left to right in the figure. The boundary A between the tilted flat surface region 89 and the curved surface region 90 is located on the right hand of the central position M of the elastic member 86 in the left-right direction in FIG. 9. In the present embodiment, provided that the elastic member 86 has a diameter of about 250 mm, the boundary A is located about 50 mm to the right of the central position M in FIG. 9. The curved surface region 90 has a radius of curvature of about 1250 mm, and is curved when viewed microscopically. As shown in FIGS. 8 and 10, the elastic member 86 has a protrusion 91 approximately at the center C thereof, which slightly protrudes from the surrounding region of the elastic member 86. The protrusion 91 is formed by fitting a disk member 93 in a shallow recess 92 formed approximately in the center of the elastic member 86. The disk member 93 has a thickness slightly greater than the depth of the recess 92. Note that the disk-like member 93 may be formed from a film material, paper, rubber or the like. As described below, the disk-like member 93 is not particularly limited as long as it is an elastic member that can be compressively deformed while the glass substrate 12 and the laminated element 16 are being laminated to each other. The protrusion 91 may be integral with the elastic member 86.

As shown in FIGS. 7 and 8, the table support means 76 includes a plate-like table support element 95 for supporting the lower surface of the table 74, a cantilever support member 97 for supporting the table support element 95 in a cantilever manner so that the free end of the table support element 95 is pivotable about the left end thereof in the figure, a plate-like intermediate support element 98 for supporting the cantilever support member 97 with the lower end thereof being fixed thereto, guide members 99 for supporting the intermediate support element 98 so as to allow the intermediate support element 98 to be raised and lowered, a base 100 for supporting the guide members 99, first raising/lowering means 101 for rotating the free end of the table support element 95, and second raising/lowering means 102 for raising and lowering the intermediate support element 98. The first raising/lowering means 101 and the second raising/lowering means 102 form moving means for moving the table 74 toward and away from the vacuum grid 73.

The first raising/lowering means 101 includes a cam 105 having a top surface 104 tilted upward to the right in FIG. 7, a feed screw shaft mechanism 107 for moving the cam 105 in the horizontal direction, the left-right direction in FIG. 7, by rotation of a motor 106, and a cam roller 108 fixed approximately to the center of the lower surface of the table support element 95 and having its outer peripheral surface in contact with the tilted surface 104. The first raising/lowering means 101 operates as follows: as the cam 105 moves to the left in FIG. 7 by rotation of the motor 106, the cam roller 108 moves upward while rolling along the tilted surface 104. As a result, the free end of the table support element 95 is moved toward the vacuum grid 73.

The second raising/lowering means 102 has substantially the same structure as that of the first raising/lowering means 101. The second raising/lowering means 102 includes a cam 111 having a top surface 110 tilted upward to the right in FIG. 7, a feed screw shaft mechanism 113 for moving the cam 111 in the horizontal direction by rotation of a motor 112, and a cam roller 114 fixed approximately to the center of the lower surface of the intermediate support element 98 and having its outer peripheral surface in contact with the tilted surface 110. The second raising/lowering means 102 operates as follows: as the cam 111 moves to the left from the position in FIG. 7 by rotation of the motor 112, the cam roller 114 moves upward while rolling along the tilted surface 110, thereby raising the intermediate support element 98. The first raising/lowering means 101 and the table 74 are raised and lowered in this way.

As shown in FIGS. 7 and 8, the lock mechanisms 77 are provided approximately at regular intervals at three brackets 78, respectively, in order to lock three sides of the lid 72 except the side about which the lid 72 is pivoted (i.e., the right end in FIG. 7). Each lock mechanism 77 includes a fixed cam 117 having a bottom surface 116 tilted upward to the left in FIG. 7, a base block 119 movable in the horizontal direction by a cylinder 118, a pressing plate 120 supported on the base block 119 and capable of being raised and lowered, and capable of pressing the edge region of the lid 72 with its tip, a cam roller 121 rotatably supported by the pressing plate 120 and having its outer peripheral surface in contact with the tilted surface 116, and a spring member 122 for biasing the cam roller 121 against the tilted surface 116.

More specifically, the lock mechanisms 77 operate as follows: when the cylinder 118 moves the pressing plate 120 horizontally to the right in the figure in the unlocked state in FIG. 11(A), the cam roller 121 rolls on the tilted surface 116 by the biasing force of the spring member 122, whereby the pressing plate 120 is lowered toward the base block 119. In the locked state in FIG. 11(B), the tip portion of the pressing plate 120 is pressed against the outer surface of the lid 72.

Hereinafter, effects of the laminating device 70 will be described.

First, with the lid 72 being opened (see FIG. 8), the rear surface of the wafer 13 is sucked and held at a prescribed position on the top surface of the vacuum grid 73 in the figure so that the double-sided adhesive tape 15 of the laminated element 16 faces upward. The glass substrate 12 is sucked and held on the table 74. The lid 72 is then rotated to the closed state in FIG. 7 by the motor 80, and the lock mechanisms 77 lock the lid 72. In this state, as shown in enlarged view in FIG. 12, the glass substrate 12 approximately faces the double-sided adhesive tape 15 of the laminated element 16 at a prescribed distance.

Figure 12:
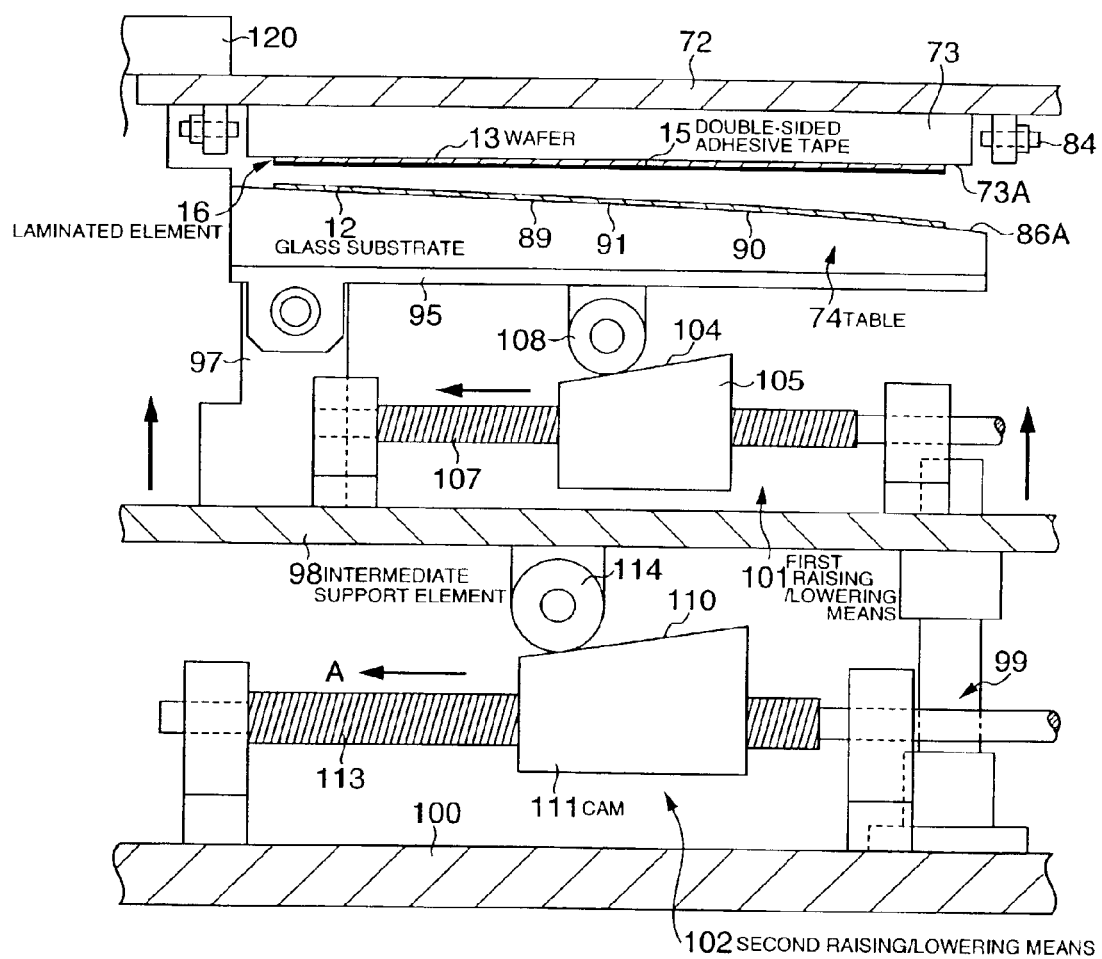
FIG. 12 is an enlarged cross sectional view of an essential portion of the laminating device, showing the state before laminating operation.
Figure 13:
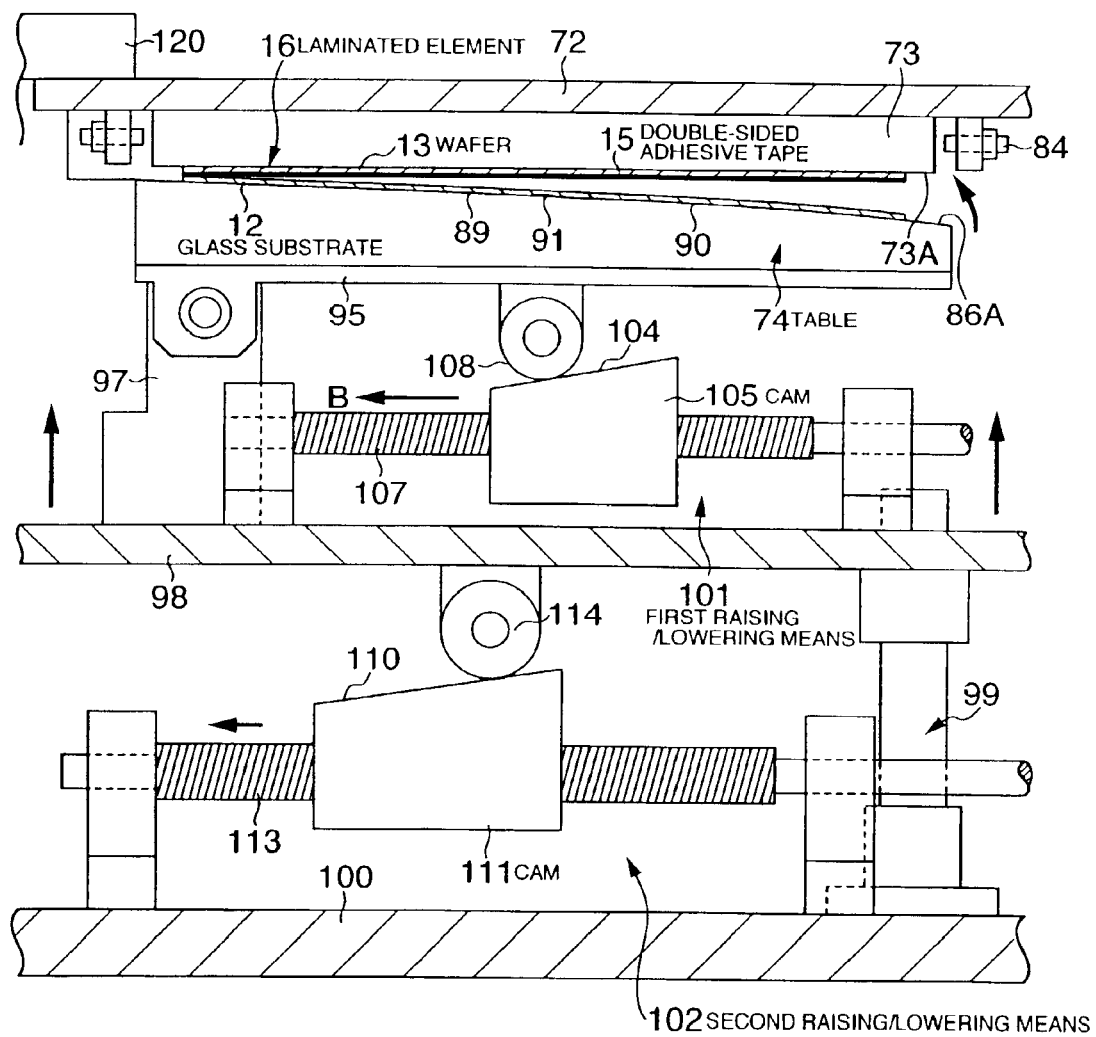
FIG. 13 is an enlarged cross sectional view of the essential portion of the laminating device, showing the early stage of the laminating operation.
Figure 14:
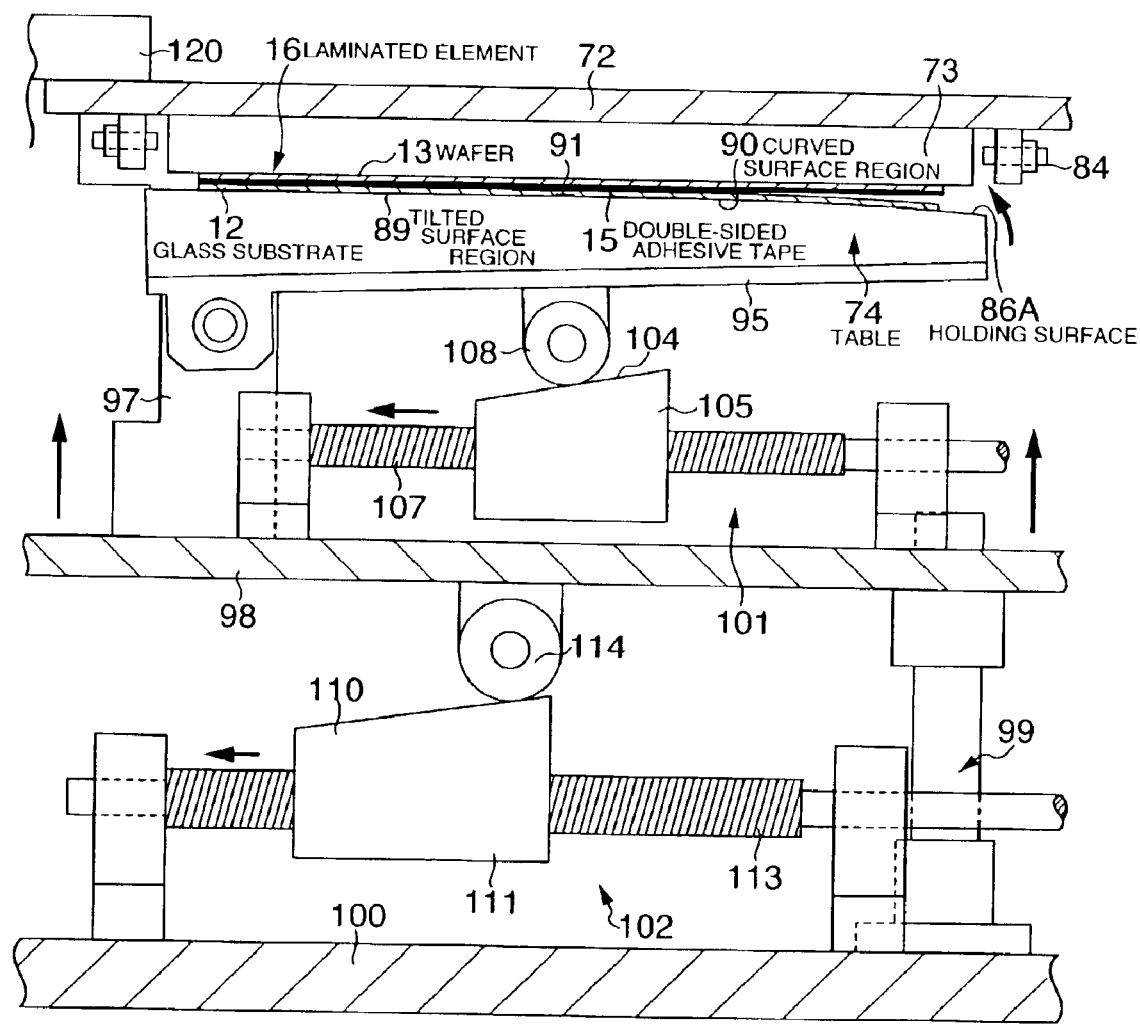
FIG. 14 is an enlarged cross sectional view of the essential portion of the laminating device, showing the state during the laminating operation.
Figure 15:
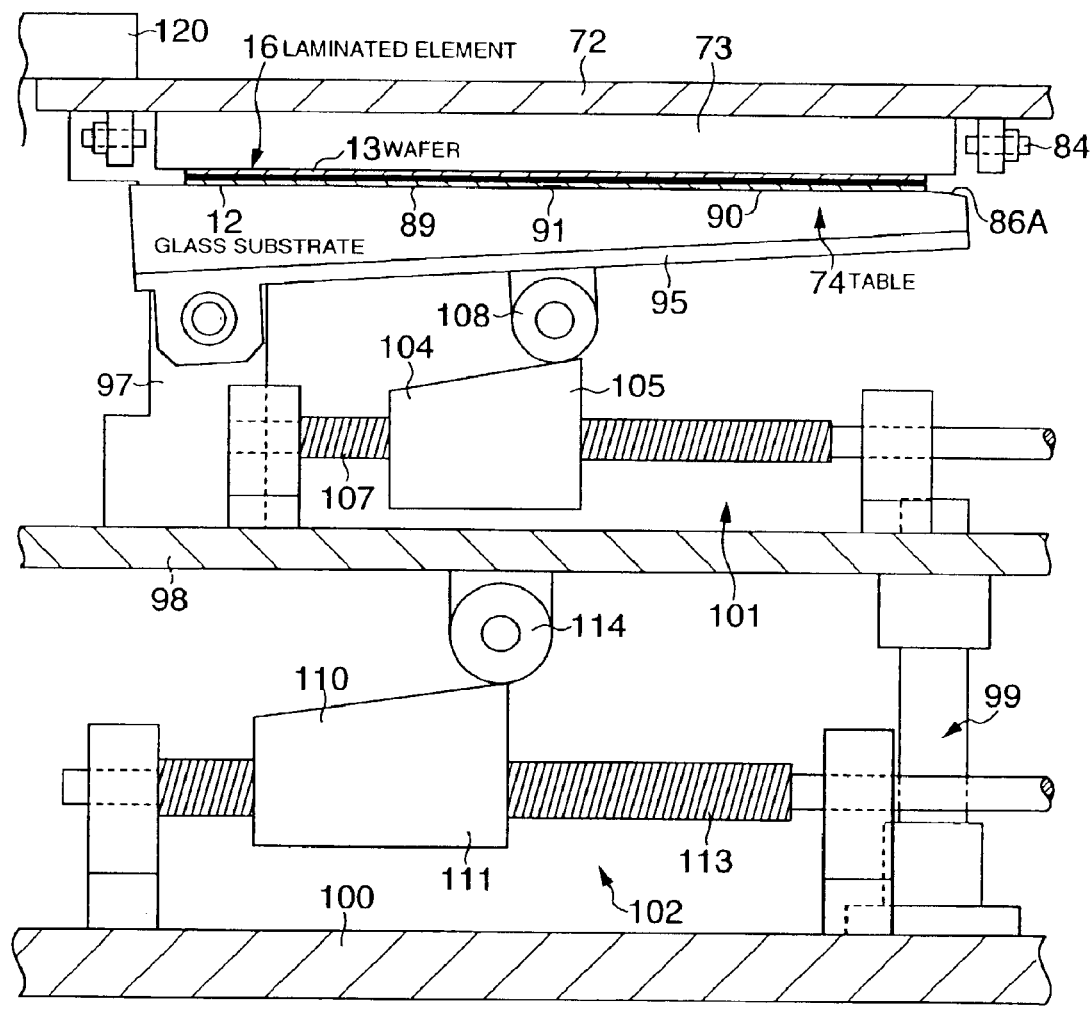
FIG. 15 is an enlarged cross sectional view of the essential portion of the laminating device, showing the state after completion of the laminating operation.

Driving of the motor 112 of the second raising/lowering means 102 (see FIG. 7) then moves the lower cam 111 in the direction shown by arrow A in FIG. 12, whereby the intermediate support element 98 is raised and thus the first raising/lowering means 101 and the table 74 are raised. As shown in FIG. 13, the left end of the glass substrate 12 located closest to the laminated element 16 first contacts the laminated element 16. The second raising/lowering means 102 continuously raises the table 74, and the motor 106 of the first raising/lowering means 101 (see FIG. 7) starts driving the cam 105. The cam 105 thus moves in the direction shown by arrow B in FIG. 13, and the free end of the table 74, the right end in the figure, is rotated upward accordingly. In this way, with elastic deformation of the holding surface 86A, the glass substrate 12 and the laminated element 16 are gradually laminated from the outer end of the tilted flat surface region 89 toward the outer end of the curved surface region 90 while removing a very small amount of air present therebetween, as shown in FIG. 14. The glass substrate 12 and the laminated element 16 are thus laminated each other approximately completely as shown in FIG. 15. Note that, in the above laminating operation, the adhesive of the double-sided adhesive tape 15 is melted by the heating means 83 (FIG. 9) in order to facilitate removal of the air present between the glass substrate 12 and the laminated element 16 to the outside.

According to the second embodiment, the air can be reliably prevented from being trapped between the glass substrate 12 and the laminated element 16 in the resultant lamination even when the operation of laminating the glass substrate 12 and the laminated element 16 is not conducted in a vacuum chamber.

Since the glass substrate 12 is held by the elastic member 86, the elastic member 86 is compressively deformed while the glass substrate 12 and the laminated element 16 are being laminated to each other. The elastic member 86 thus absorbs the load that is intensively applied to a prescribed part of the glass substrate 12 and the wafer 13. As a result, the glass substrate 12 and the wafer 13 can be prevented from being damaged in the laminating operation.

Moreover, the elastic protrusion 91 provided approximately in the center of the elastic member 86 slightly protrudes therefrom. Since the protrusion 91 is compressively deformed in the laminating operation, the air can be effectively prevented from being trapped in the region around about the center of the glass substrate 12 where the air is most likely to be trapped.

Note that the glass substrate 12 and the laminated element 16 may be laminated to each other with the laminated element 16 being held on the table 74 and the glass substrate 12 being held on the vacuum grid 73.

Operation of the table 74 may be conducted by the vacuum grid 73. Alternatively, this operation may be divided between the vacuum grid 73 and the table 74.

The elastic member 86 may be formed from a material other than silicone rubber as long as it is compressively deformable in the laminating operation.

The laminating device 70 may have a structure capable of laminating the glass substrate 12 and the laminated element 16 in a substantially vacuum space.

The heating means 83 of the second embodiment may be applied to the first embodiment.

In each of the above embodiments, the glass substrate 12 and the laminated element 16 are laminated to each other. However, the present invention is not limited to this, and other members having opposing laminating surfaces may be laminated each other.

The structure of each part of the laminating device of the present invention is not limited to the illustrated example, and various modifications can be made as long as substantially the same effects are obtained.

As has been described above, according to the present invention, the holding surface of one of the holding means for holding the first and second members to be laminated, respectively, has a curved surface region so that the distance between the first and second members to be laminated is gradually increased toward the outside. The first and second holding means become close to each other by the moving means so that the first and second members to be laminated can be gradually laminated to each other toward the outer end of the curved surface region. This enables the air remaining between the first and second members to be laminated to be removed to the outside along the curved surface region in the operation of laminating the first and second members to be laminated. As a result, the air can be prevented from being trapped in the resultant lamination in the operation of laminating the first and second members to be laminated.

Moreover, the pair of driving devices provided at symmetric positions with respect to the center of the curved surface region are simultaneously or alternately operated to gradually make the first and second holding means close to each other. This enables the first and second holding means to become close to each other with one holding surface tilted with respect to the other. In combination with the shape of the curved surface region, this structure makes it possible to implement the aforementioned removal of the air with improved reliability.

Moreover, the cylinders enables the respective connecting members provided in at least one of the first and second holding means to move in the direction that the first and second holding means become close to and away from each other. Each connecting member has a joint that enables bending of the connecting member. Such bending of the connecting members enables the operation of laminating the members to be conducted smoothly.

Moreover, the protrusion formed from an elastic material is provided approximately at the center of the holding surface of one holding means so as to slightly protrude from the surrounding region. Since the protrusion can be compressively deformed while the first and second members to be laminated are being laminated to each other, the air can be reliably prevented from being trapped in a region where the air is likely to be trapped.

Moreover, the holding means for holding the member to be laminated having an adhesive has heating means for heating the adhesive. This facilitates removal of the air present between the first and second members to be laminated to the outside in the laminating operation.

Moreover, since the first and second members to be laminated can be laminated in a substantially vacuum space, the air can be more reliably prevented from being trapped between the first and second members to be laminated in the laminating operation.

Industrial Applicability

For example, the present invention can be utilized as an apparatus and method for laminating a semiconductor wafer and a glass substrate by using an adhesive tape.

What is claimed is:

1. A laminating device for laminating first and second members to be laminated, said device comprising:

first and second holding means for holding the first and second members on holding surfaces of said first and second holding means, respectively, wherein the holding surface of said second holding means has a curved surface region such that a distance between the first and second members gradually increases outwardly;

moving means for moving the first and second holding means toward each other so as to gradually laminate the first and second members to each other in a direction extending toward an edge of the curved surface region; and a protrusion formed approximately at a center of the holding surface of said second holding means, said protrusion slightly protruding from a surrounding region of said holding surface and being compressively deformable by the second member being laminated to the first member.

2. A laminating device for laminating first and second members to be laminated, said device comprising:

first and second holding elements having first and second holding surfaces which are adapted to hold the first and second members, respectively, wherein the second holding surface has a curved surface region such that a distance to the first holding surface gradually increases from a center of said curved surface region outwardly;

a driving element adapted to move the first and second holding elements toward each other so as to gradually laminate the first and second members to each other from central regions of the first and second members outwardly; and a protrusion formed approximately at a center of the second holding surface, said protrusion slightly protruding from a surrounding region of said second holding surface and being compressively deformable by the second member being laminated to the first member.

3. The laminating device according to claim 2, wherein the driving element includes a pair of driving devices provided at symmetric positions with respect to the center of the curved surface region, and the first and second holding elements are gradually moved toward each other by simultaneously or alternately operating the driving devices.

4. The laminating device according to claim 3, wherein each of said driving devices includes a cylinder that enables a corresponding connecting member provided in at least one of the first and second holding elements to move in the direction in which the first and second holding elements are moved toward and away from each other, and each connecting member has a joint that makes said connecting member bendable.

5. The laminating device according to claim 2, wherein:
the second holding element is a curved pad;
the curved pad has the curved surface region at a tip portion thereof so that a thickness of said curved pad reduces gradually reduced from the center of said curved surface region outwardly.

6. The laminating device according to claim 5, wherein the curved pad is a hard member and the curved surface region is a mirror-finished region.

7. A laminating device for laminating first and second members to be laminated, said device comprising:
a first holding element having a first holding surface adapted to hold thereon the first member; and
a second holding element having a second holding surface adapted to hold thereon the second member; wherein
said second holding element is moveable toward said first holding element;
said first and second holding surfaces face toward each other;
the second holding surface has a flat surface region, and a curved surface region adjacent said flat surface region, both said flat and curved regions being adapted to come in contact with the second member; and
at least one of the members to be laminated has an adhesive on a laminating surface thereof, and the corresponding holding element has a heating element for heating the adhesive.

8. A laminating device for laminating first and second members to be laminated, said device comprising:
a first holding element having a first holding surface adapted to hold thereon the first member; and
a second holding element having a second holding surface adapted to hold thereon the second member; wherein
said second holding element is moveable toward said first holding element;
said first and second holding surfaces face toward each other; and the second holding surface has a flat surface region, and a curved surface region adjacent said flat surface region, both said flat and curved regions being adapted to come in contact with the second member;
said laminating device further comprising a substantially vacuum space in which the first and second members are to be laminated to each other.

9. A method of laminating first and second members to each other, said method comprising:
providing a laminating apparatus having first and second holding surfaces facing each other, said second holding surface being moveable relative to the first holding surface and comprising a flat region and a curved region;
holding the first member on the first holding surface;
holding the second member on both the flat and curved regions of the second holding surface; and
gradually laminating the first member to the second member in a direction from the flat region toward the curved region.

10. The method according to claim 9, wherein said laminating step further comprises compressively deforming, by said second member, a deformable projection located at a central location of said second holding surface, whereby preventing air from being trapped between the first and second members in a vicinity of said central location.

11. The method according to claim 9, wherein said holding step comprises arranging a first, peripheral portion of the second member in the flat region and a second, opposite peripheral portion of the second member in the curved region.

12. The method according to claim 11, wherein said laminating step comprises
initially pressing the first portion of the second member held in the flat region of the second holding surface against the first member; and
subsequently pressing a remainder of the second member against the first member until the second portion of the second member held in the curved region of the second holding surface has been laminated to the first member, thereby finishing said laminating step.

13. The method according to claim 12, wherein said step of subsequently pressing includes pivoting the second member held on the second holding surface about an axis closer to the flat region than the curved region.

14. The method according to claim 13, wherein, in said step of pivoting, the second member held on the second holding surface is rotated in only one of clockwise and counterclockwise directions until the first and second members have been completely laminated to each other.

15. A laminating device for laminating first and second members to be laminated, said device comprising:
a first holding element having a first holding surface adapted to hold thereon the first member; and
a second holding element having a second holding surface adapted to hold thereon the second member; wherein
said second holding element is moveable toward said first holding element;
said first and second holding surfaces face toward each other;
the second holding surface has a flat surface region, and a curved surface region adjacent said flat surface region, both said flat and curved regions being adapted to come in contact with the second member; and
said flat region is arranged at an end of the second holding surface and continuous to the curved region which is arranged at an opposite end of the second holding surface.

16. A laminating device for laminating first and second members to be laminated, said device comprising:

a first holding element having a first holding surface adapted to hold thereon the first member; and a second holding element having a second holding surface adapted to hold thereon the second member; wherein said second holding element is moveable toward said first holding element;

said first and second holding surfaces face toward each other;

the second holding surface has a flat surface region, and a curved surface region adjacent said flat surface region, both said flat and curved regions being adapted to come in contact with the second member; and said second holding element includes a plurality of suction holes arranged in both the flat and curved regions for holding the second member on said second holding surface in said flat and curved regions.

17. A laminating device for laminating first and second members to be laminated, said device comprising:

a first holding element having a first holding surface adapted to hold thereon the first member; and a second holding element having a second holding surface adapted to hold thereon the second member; wherein said second holding element is moveable toward said first holding element;

said first and second holding surfaces face toward each other; and the second holding surface has a flat surface region, and a curved surface region adjacent said flat surface region, both said flat and curved regions being adapted to come in contact with the second member;

said laminating device further comprising a protrusion formed approximately at a center of the second holding surface; wherein said protrusion is compressively deformable by the second member being laminated to the first member;

said flat region occupies more than half a total area of the second holding surface; and said protrusion is located within said flat region.

\* \* \* \* \*